(12) United States Patent
Morisson

(10) Patent No.: US 7,671,637 B2
(45) Date of Patent: Mar. 2, 2010

(54) DIFFERENTIAL TRANSISTOR PAIR CURRENT SWITCH SUPPLIED BY A LOW VOLTAGE VCC

(75) Inventor: Richard Morisson, Grenoble (FR)

(73) Assignee: E2V Semiconductors (FR)

( * ) Notice: Subject to any disclaimer, the term of this patent is extended or adjusted under 35 U.S.C. 154(b) by 0 days.

(21) Appl. No.: 11/994,134

(22) PCT Filed: Jun. 6, 2006

(86) PCT No.: PCT/EP2006/062935

§ 371 (c)(1),
(2), (4) Date: Jul. 17, 2008

(87) PCT Pub. No.: WO2007/000387

PCT Pub. Date: Jan. 4, 2007

(65) Prior Publication Data

US 2009/0140777 A1    Jun. 4, 2009

(30) Foreign Application Priority Data

Jun. 28, 2005    (FR) .................................. 05 06563

(51) Int. Cl.
*H03K 3/00*    (2006.01)
(52) U.S. Cl. ........................ 327/108; 327/65; 327/365
(58) Field of Classification Search .................. 327/65, 327/108, 365
See application file for complete search history.

(56) References Cited

U.S. PATENT DOCUMENTS 6,166,566 A * 12/2000 Strong .......................... 327/72

(Continued)

FOREIGN PATENT DOCUMENTS

EP    0620638 A2    10/1994

(Continued)

OTHER PUBLICATIONS

Sumanen L et al: "A 10-Bit High-Speed Low-Power CMOS D/A Converter in 0.2 mm <2>"; Electronics, Circuits and Systems, 1998 IEEE International Conference on Lisboa, Portugal Sep. 7-10, 1998, Piscataway, NJ, USA, IEEE, US, vol. 1, September 7, 1998, p. 15-18, XP010366161; ISBN: 0-7803-5008-1.

*Primary Examiner*—Kenneth B. Wells
(74) *Attorney, Agent, or Firm*—Lowe Hauptman Ham & Berner, LLP

(57) ABSTRACT

The invention relates to current switches using a differential pair of transistors and being able to operate under a low supply voltage Vcc. According to the invention, provision is made for the current switch to include two differential pairs of two transistors each (T1, T1b; T2, T2b), cascaded together, the second pair (T2, T2b) having complementary current outputs (H, Hb) that flip according to the states of the inputs (E, Eb). The first pair (T1, T1b) is connected to a ground (GND) through a current source, supplying a current of value Io and comprising a transistor (Ts1) biased by a voltage Vbias, and it is supplied by a voltage equal to N·Vbe+Vbias, where N is a whole number (preferably equal to 1) and Vbe is the base-emitter voltage of the transistor (Ts1). The second pair (T2, T2b) is connected to ground directly through a resistance (R2). The invention can be applied to the on-off control of sample-and-hold circuits, multiplexers, fast low-voltage logic circuits, etc.

7 Claims, 3 Drawing Sheets

U.S. PATENT DOCUMENTS

| | | | |
|---|---|---|---|
| 6,429,700 B1 * | 8/2002 | Yang | 327/108 |
| 6,466,064 B2 * | 10/2002 | Kurogouchi et al. | 327/113 |
| 7,365,302 B2 * | 4/2008 | Yamaguchi et al. | 250/214 R |
| 2003/0141924 A1 | 7/2003 | Cosand | |
| 2005/0068066 A1 | 3/2005 | Yamashita et al. | |

FOREIGN PATENT DOCUMENTS

JP  64-049317  2/1989

* cited by examiner

DIFFERENTIAL TRANSISTOR PAIR CURRENT SWITCH SUPPLIED BY A LOW VOLTAGE VCC

CROSS-REFERENCE TO RELATED APPLICATIONS

The present Application is based on International Application No. PCT/EP2006/062935 filed on Jun. 6, 2006, which in turn corresponds to French Application No. 05 06563 filed on Jun. 28, 2005, and priority is hereby claimed under 35 USC §119 based on these applications. Each of these applications are hereby incorporated by reference in their entirety into the present application.

FIELD OF THE INVENTION

The invention relates to analog and logic integrated circuits, and in particular those using supply voltage sources supplying very low voltage (less than or equal to 3 volts).

BACKGROUND OF THE INVENTION

In a number of applications, it is desirable to control an on-off analog or logic circuit by a pair of control currents operating in a differential manner; to this end, this leads to the use of a current switch in the form of a pair of transistors T1 and T1b in two parallel branches supplied by a common constant current source according to the diagram of FIG. 1. The current source is in general formed by an NPN transistor Ts1 and its emitter resistance Re1, the base of this transistor being controlled by a constant bias voltage Vbias. The transistors T1 and T1b have their emitters joined together and both connected to this current source; they are controlled by their bases B1 and B1b in a differential manner, a high voltage level being applied to the base of one of the transistors while a low level is applied to the base of the other. The current from the current source passes through one of the transistors, namely the one with its base at the high level. The collectors of the transistors are used to supply current, in a differential manner, to two complementary control inputs H and Hb of an analog or logic circuit CC. The operation of the circuit CC is defined by the choice of input receiving the current, therefore by the sign of the differential voltage applied between the bases B1 and B1b of the transistors. The control inputs of the analog or logic circuit can simply be complementary clock inputs causing the circuit to alternate between one state and another. For example, if the circuit is a sample-and-hold circuit, the clock causes the circuit to alternate between a sampling mode (H at the high level, Hb at the low level) and a holding mode (Hb at the high level, H at the low level).

In the following, the group of two transistors with their emitters joined together and their bases controlled by two complementary logic signals will be referred to as a differential pair of transistors.

The transistor terms base, emitter and collector will be used here with reference to bipolar transistors as in FIG. 1. The same explanations apply to MOS transistors, replacing the terms base, emitter and collector with gate, source and drain; for the sake of simplification, explanations referring to bipolar transistors will therefore be adopted without the invention being limited to bipolar technologies, and the terms base, emitter and collector will be considered generic in this patent application.

Current switching stages in the form of differential pairs can be used in cascaded arrangements in integrated circuits, in particular when there is a requirement for a relatively high output current while it is not desired to excessively load the output of an upstream stage. A difficulty arises however when the supply voltages are low since the levels around which the base control voltages vary cannot be chosen arbitrarily; the high level and the low level must be sufficiently different in order that the differential pair may flip firmly from one state to the other; and their average level must be neither too high nor too low. If it is too low, the transistors cannot be made conducting and the constant current source which in general supplies the two transistors is not biased correctly; if it is too high the outputs of the differential pair are at too high a level to enable the analog or logic circuit to be controlled effectively, due to saturation. As the output of a differential pair is necessarily at a higher voltage level than the input (as regards the high output state), it may also be necessary to provide level translation stages between two cascaded differential pairs in order to lower the output voltage level before attacking a downstream stage. This is all the more necessary if the circuit to be controlled requires, for its correct operation, the inputs H and Hb to remain at a relatively low voltage level.

Hence it is understood that the various operational constraints of current switches formed by cascaded differential pairs mean:

either being forced to use a higher supply voltage Vcc than desired (and this is critical for circuits powered by low-voltage batteries as is very often the case in portable devices), or not being able to have, at the output of the switch, voltage values that are low enough to correctly control the circuit intended to be controlled.

FIG. 2 represents a typical example of using cascaded differential pairs in a prior art control circuit. It uses two differential pairs T1, T1b and T2, T2b.

The first differential pair forms the input of the current switching circuit; it has two transistors T1 and T1b and the emitters of these transistors are connected to a constant current source formed by a transistor Ts1 and its emitter resistance Re1, the base of this transistor being connected to a bias voltage Vbias. The current source supplies a constant current Io, which is temperature-controlled and preferably a current that is independent of temperature over the operating range of the circuit. The collectors of the transistors T1 and T1b are connected to collector resistances R1 and Rb1 respectively. The bases of the transistors of the first pair are connected to the two inputs E and Eb of the current switch circuit. The outputs of the first differential pair are drawn from the collectors of the transistors T1 and T1b.

The analog or logic circuit to be controlled is still denoted by the block CC in FIG. 2. It can be a sample-and-hold circuit, a multiplier or a multiplexer, for example. It is supplied between the power source at voltage Vcc and ground GND. It has two complementary logic control current inputs H and Hb. These control inputs are formed by the outputs of the second differential pair T2, T2b, and these outputs are the collectors of the transistors T2 and T2b. The second pair is supplied with current by a current source formed by a transistor Ts2 and its emitter resistance Re2, the base of the transistor Ts2 receiving the same constant bias voltage Vbias. The current source Ts2 supplies a current Io or a current proportional to Io. In the following, for the sake of simplification, a current of value Io will be considered, but it is well known that with the same bias voltage Vbias, a current k·Io can be produced in Ts2 when the effective emitter surface area of Ts2 is k times that of Ts1 and when the emitter resistance Re2 is k times lower than Re1.

By applying alternated complementary signals to the inputs E and Eb, the inputs H and Hb that control the circuit CC to be controlled are made to switch.

To this end, the outputs of the first differential pair are connected directly or indirectly to the inputs of the first pair. In this case, a level translation stage is provided between the two pairs in order to lower the level of the output voltages of the first pair before applying them to the inputs of the second.

The outputs of this translation stage are applied to the bases of the transistors T2 and T2b.

The level translation stage in this assembly is made up of two identical branches, one placed between a first output (collector of T1) of the first pair and a first input (base of T2) of the second pair, the other placed between a second output (collector of T1b) of the first pair and a second input (base of T2b) of the second pair. Each branch of the translation stage includes in this case three transistors in series: T3, T4 and Ts3, and an emitter resistance Re3 for the first branch, and T3b, T4b, Ts3b and Re3b for the second branch. The transistor T3 has its collector at Vcc, its emitter connected to the collector of T4, and its base connected to the output of the first differential pair (output taken at the collector of T1). The transistor T4 is mounted as a diode (collector connected to its base), its emitter is connected to the collector of Ts3 and its collector is connected to the emitter of T4. Lastly, the transistor Ts3 has its emitter connected through the resistance Re3 to ground, and its base supplied by the bias potential Vbias. The dimensions of the transistor Ts3 and of the resistance Re3 are calculated in order that this source supplies a current Io or a current in a chosen ratio of proportionality with Io. The emitter of the transistor T4 mounted as a diode forms an output of the stage of this branch of the translation stage and it is connected to the base of the transistor T2 of the second differential pair. This stage lowers, by a transistor base-emitter voltage value Vbe (typically about 0.8 volts), the output potentials of the first differential pair before applying them to the second pair. If it is desired to lower the level by 2Vbe, or 3Vbe, other transistors, mounted as diodes, would be inserted between T4 and Ts3.

The other branch of the translation stage is identical and connected between the collector of the transistor T1b and the base of the transistor T2b.

The design of this circuit imposes a minimum value on the voltage Vcc for the circuit to operate correctly. This minimum value depends essentially on voltage drops introduced by the base-emitter voltages of the various transistors that are found in the circuit.

It is desirable to search for circuits allowing the use of a lower supply voltage Vcc than that which the circuits of the prior art allow (without reducing the switching speed).

SUMMARY OF THE INVENTION

To this end, the invention proposes a current switch including two differential pairs of two transistors each, these pairs being arranged in cascade form, the second pair having complementary current outputs, one of which supplies current while the other is blocked and vice versa depending on the state of a differential signal applied between the bases of the two transistors of the first pair, the first pair being connected to a ground through a constant current source supplying a current of value Io, this source comprising a transistor, the base of which is held at a bias voltage Vbias, characterized in that on the one hand the second differential pair is connected to ground directly through a resistance and in that on the other hand the first differential pair is supplied by a voltage equal to N·Vbe+Vbias, where N is a whole number (preferably equal to 1) and Vbe is the base-emitter voltage of the transistor of the current source supplying the current Io.

From this arrangement, it emerges, as will be explained in detail later, that there can be applied to the base of a transistor of the second differential pair a voltage equal to Vbias which makes that transistor conducting (conducting a current Io or a current proportional to Io); thus, the bases of the transistors of the second pair can receive a level control voltage that is lower than in the prior art (generally Vbias+Vbe in the prior art), from which it emerges that the whole circuit can be supplied using a main supply voltage Vcc that is lower than the one that was required in the prior art.

The first differential pair preferably has voltage supplied by a supply transistor placed in series between a main supply voltage source Vcc and the differential pair, the supply transistor having its base controlled by a junction node between a low-voltage-drop current source connected to the supply voltage Vcc and a series-connected group, connected to ground, of several transistors mounted as diodes and a resistance, the voltage Vbias being taken at the base of one of the transistors mounted as a diode.

The base of this supply transistor thus receives a voltage equal to Vbias+(N+1)Vbe and the emitter of this transistor supplies a voltage Vbias+N·Vbe to the first differential pair.

The current source is preferably temperature-regulated and/or supply-regulated; it is preferably a bandgap type source; in principle, it uses PNP or PMOS transistors.

In another embodiment not requiring PNP or PMOS transistors and therefore able to be used in fast technologies employing only NPN bipolar transistors, the first differential pair is supplied by the main supply voltage Vcc through a mere resistance; this resistance has a current flowing through it (in principle 2Io) such that the voltage drop across its terminals is equal to Vcc−(Vbias+N·Vbe), and to this end this resistance is placed in series with an NPN or NMOS transistor which diverts to ground a determined emitter current (in principle Io).

In yet another variant, a temperature-regulated Wilson current source is used to supply both a bias voltage Vbias and a supply voltage equal to Vbias+N·Vbe.

Still other advantages of embodiments according to the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious respects, all without departing from the invention.

BRIEF DESCRIPTION OF THE DRAWINGS

The present invention is illustrated by way of example, and not by limitation, in the figures of the accompanying drawings, wherein elements having the same reference numeral designations represent like elements throughout and wherein.

DETAILED DESCRIPTION OF THE DRAWINGS

Figure 2:
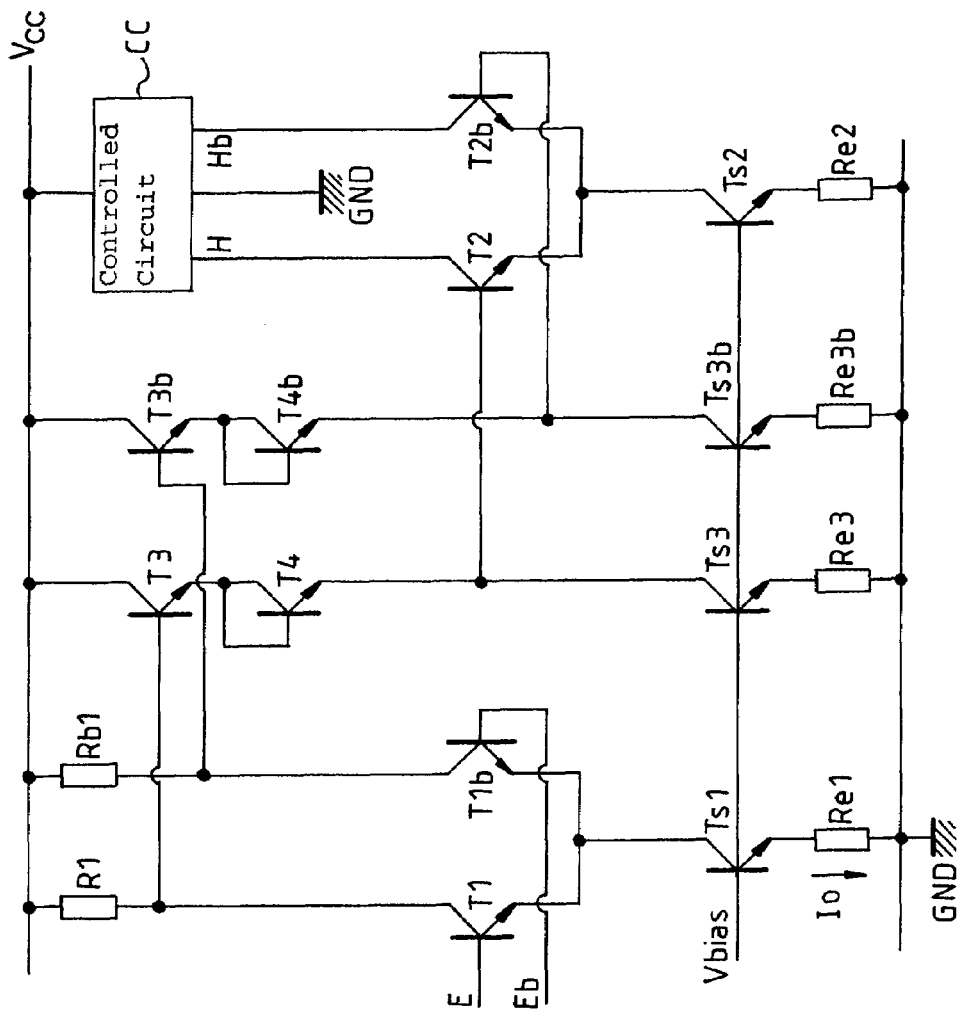
FIGS. 1 and 2, already described, represent current switch circuits of the prior art.
Figure 1:
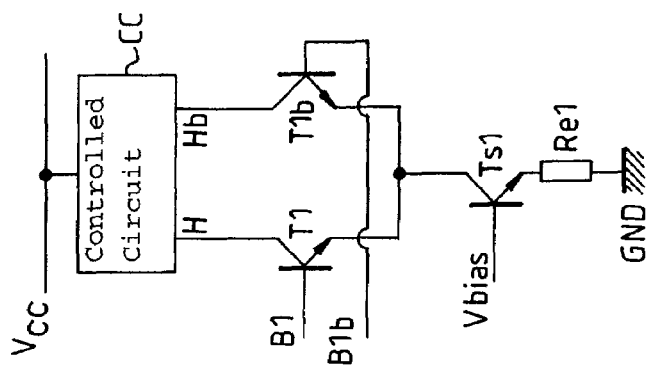
Figure 3:
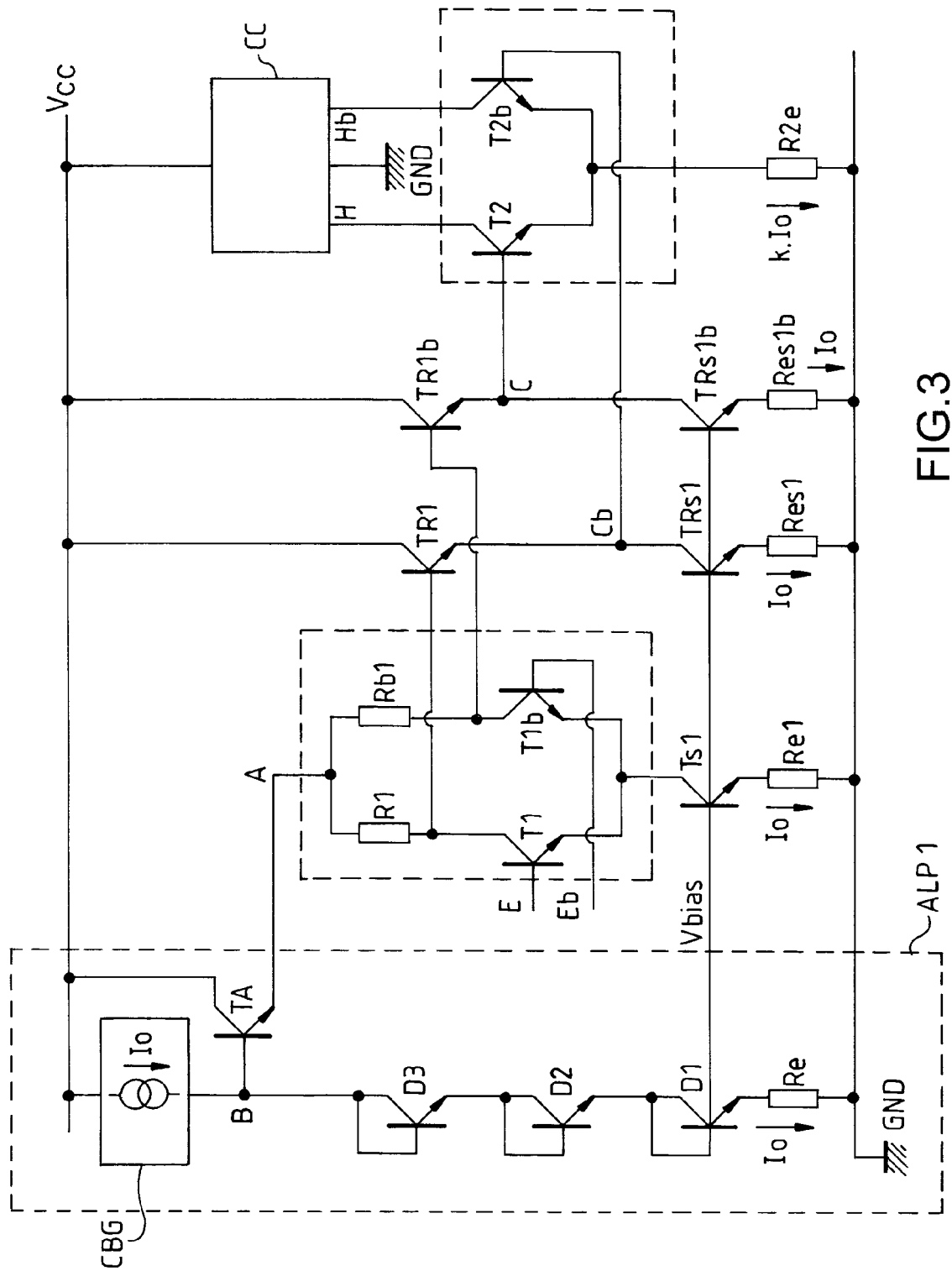
FIG. 3 represents the circuit according to the invention in a first embodiment.

In FIG. 3, the electronic function to be controlled, analog or digital, is still denoted by CC, supplied between Vcc and ground and controlled by the complementary inputs H and Hb which at the same time are the complementary outputs of a current switch according to the invention.

By way of example, it is assumed that the circuit CC is a sample-and-hold circuit and that the current-based control intended for the terminals H and Hb is a control action by a clock, the complementary current-based outputs of which are alternated to cause the sample-and-hold circuit to alternate between a sampling mode and a holding mode.

First of all, the current switch comprises the following main items:

- a first differential pair of two transistors T1, T1b, the inputs E and Eb of which receive complementary control signals;
- a second differential pair of two transistors T2, T2b, the outputs of which are connected to the current-based control terminals H and Hb of the circuit CC, and the inputs of which are connected to the outputs of the first differential pair, directly or via a level translation stage (in FIG. 3, there is one level translation stage);
- a voltage supply circuit ALP1 for the first differential pair T1, T1b, the latter not being supplied directly by the main supply voltage Vcc.

The first differential pair includes two identical transistors T1 and T1b; they are connected via their emitters to a constant current source placed in series between these emitters and ground GND; the source supplies a current Io; the first pair also includes collector resistances R1 and Rb1, which are identical, between the collector of each transistor and a common point A which is the output of the voltage supply circuit ALP1. The bases of the transistors T1 and T1b are connected to the inputs E and Eb of the circuit.

The current source of this pair T1, T1b is formed by a transistor Ts1 in series with an emitter resistance Re1; the base of the transistor Ts1 is controlled by a fixed bias voltage Vbias; the voltage Vbias is chosen conventionally according to the dimensions of the transistor, the value of the resistance Re1 and the value of the current Io desired in the first pair. The dimensions of the transistors T1, T1b and Ts1 are in principle identical.

The outputs of the first pair T1, T1b, are taken at the collectors of the transistors T1 and T1b.

In the example of FIG. 3, which is a preferred example for fast circuits (clock being able to reach several gigahertz), a level translation stage has been inserted between the outputs of the first differential pair and the inputs of the second pair. The purpose of the translation stage is to lower the levels of the potentials of the outputs of the first pair before applying them to the inputs of the second pair.

The translation stage comprises, for each output of the pair T1, T1b associated with a respective input of the pair T2, T2b, a respective follower half-stage. The follower half-stage comprises a follower transistor TR1 (or TR1b for the other half-stage) in series with a respective current source. The current source is formed by a transistor TRs1 (or TRs1b) and an emitter resistance Res1 or Res1b. The base of this transistor receives the same voltage Vbias as the other current sources in the diagram. The dimensions of the transistors TR1, TR1b, TRs1, TRs1b are in principle identical. Moreover, the transistors TRs1 and TRs1b are identical to the transistor Ts1, and the resistances Res1 and Res1b are identical to the resistance Re1. Nevertheless, conventionally, it is possible to provide for the various current sources to have transistor dimensions that are proportional and not identical to one another, the proportionality relationship conventionally regulating the relationship between the currents in the various branches (the resistances are then inversely proportional to the dimensions of the transistors). Thus, if the nominal current levels that must flow through the transistors flow through them (Io for Ts1 and for T1 or T1b, or a current proportional to Io for TRs1 and for TR1 or TR1b), then the emitter-base voltages of all these transistors have the same value Vbe. In FIG. 3, the simplifying assumption has been made that the transistors of the various current sources all have the current Io flowing through them.

The follower transistor TR1 of the first follower half-stage has its collector connected to the main supply Vcc, its emitter connected to the current source TRs1 and to the base of the transistor T2 (which forms an input of the second differential pair). The follower transistor TR2 of the second half-stage has its collector connected to the main supply Vcc, its emitter connected to the current source TRs1b and to the base of the transistor T2b (which forms another input of the second differential pair).

The second differential pair is not supplied conventionally by a constant current source that would be formed by a transistor biased by the voltage Vbias with an emitter resistance Re having the same value as the others. In this case, according to the invention, the emitters of the transistors T2 and T2b of the second pair are connected to ground through a mere resistance R2e. However, it is arranged for this resistance to have the same current Io flowing through it as the current sources already mentioned. Or more specifically, it is arranged for this resistance to have the current Io flowing through it if the transistors T2 and T2b are of the same size as the transistor Ts1, or a current k·Io flowing through it if the transistors T2 and T2b are k times larger than the transistor Ts1. The transistor size being considered here is the effective emitter surface area since it is this dimension which regulates the relationship between the base-emitter voltage and the emitter current.

To arrange for the resistance Re2 to have a current k·Io flowing through it, the resistance Re2 is given the value Re1/k.

The result of this is that in order to allow a current k·Io to flow through the transistor T2, the other transistor T2b being blocked, it is necessary to apply to its base (node C in FIG. 3) a voltage equal to k·Io·Re2+Vbe. Now this voltage is none other than Io·Re1+Vbe since Re2=Re1/k, and it is none other than Vbias since Vbias is the sum of a voltage Vbe of the transistor Ts1 and of the voltage drop in Re1.

Therefore Vbias must be applied to the nodes C or Cb to make the transistor T2 or the transistor T2b conducting with a desired current k·Io. If it is decided that the high state is that for which T2 is conducting, there is a high state when the transistor T1b is blocked and the transistor T1 is conducting.

To apply Vbias at the node C (for example) in the high state, it is observed that it is necessary to have Vbias+Vbe at the collector of T1b when the latter is blocked. Now when T1b is blocked, its collector is brought to the supply voltage of the first differential pair T1, T1b, i.e. to the potential of the node A represented in FIG. 3, the node A being the output of the voltage supply circuit ALP1 for the first differential pair.

Therefore, an arrangement is made according to the invention for applying a voltage Vbias+Vbe to the first differential pair.

However, this voltage Vbias+Vbe is calculated taking into account the fact that the level translation stage performs a translation equal to Vbe. It is possible to not have a level translation stage or to have a translation stage performing a translation of N·Vbe, where N is a whole number of a few units.

Consequently, more generally, a supply voltage equal to Vbias+N·Vbe will be applied to the first differential pair.

The current switching circuit according to the invention therefore has two particular aspects: the second differential pair is connected to ground through a mere resistance and the first differential pair is supplied by a voltage Vbias+N·Vbe, where Vbias is the bias voltage of a transistor which has Vbe for the base-emitter voltage and which forms a current source for the first pair.

In the embodiment represented in FIG. 3, the voltage supply circuit ALP1 which supplies the first differential pair T1, T1b includes the following items:

a group made up of a transistor D1 mounted as a diode (collector and base joined together) and an emitter resistance Re, this group having a fixed current Io flowing through it (if the transistor D1 is identical to Ts1 and the resistance Re is equal to Re1) or a current proportional to Io (if the transistor D1 is in a proportionality relationship with Ts1 and the resistance Re in the inverse relationship with Re1); the resistance Re is connected to ground GND and then the desired voltage Vbias appears at the base of D1, and is applied to the transistors Ts1, TRs1 and TRs1b; this is assuming of course that a desired current Io can be set up to flow through the transistor D1;

N+1 transistors (here N=1) D2, D3, mounted as diodes and identical to the transistor D1, in series with the transistor D1 and the resistance Re, the group Re, D1, D2, D3, with the current Io (or a current proportional to Io) flowing through it, being in series between ground GND and a node B on which there then appears a voltage Vbias+(N+1)·Vbe a temperature-regulated current source CBG, imposing a current Io (or a current proportional to Io) on the group in series connected at the node B; the design of this current source is chosen to exhibit the lowest possible voltage drop between the main supply Vcc and the node B; the voltage drop is for example of the order of 200 mV; its low value, associated with the voltage value Vbias+(N+1)Vbe present at the node B, ensures the low value of Vcc (for a given whole number N). By way of numerical example, if N=1, and if the voltage Vbias is about 0.9 volts, Vcc can be about 2.7 volts;

a supply transistor TA identical to Ts1, the base of which is connected to the point B, the collector of which is connected to Vcc and the emitter of which is connected to the supply node A of the first differential pair T1, T1b.

Preferably, the current source CBG is a circuit known as a "current bandgap circuit" CBG, the function of which is to produce a chosen outgoing current which is temperature-controlled (in principle independent of temperature and of the supply).

The current bandgap circuit can be formed in various ways, from known voltage bandgap circuits, i.e. circuits supplying a temperature-controlled voltage, in general a voltage that is as independent as possible of temperature. These circuits, able to establish an outgoing current, require in general at least one PMOS or PNP transistor. In short, bandgap circuits, which are well known, are current or voltage sources which rely on a known relationship, of exponential form, between the current flowing through a transistor with a given base-emitter voltage and a given transistor surface area, and the temperature. These circuits rely on a balance of currents and voltages, independent of temperature (most often) or controlled as a function of temperature, in branches comprising transistors, the actions of which are compensated for during temperature variations.

Figure 4:
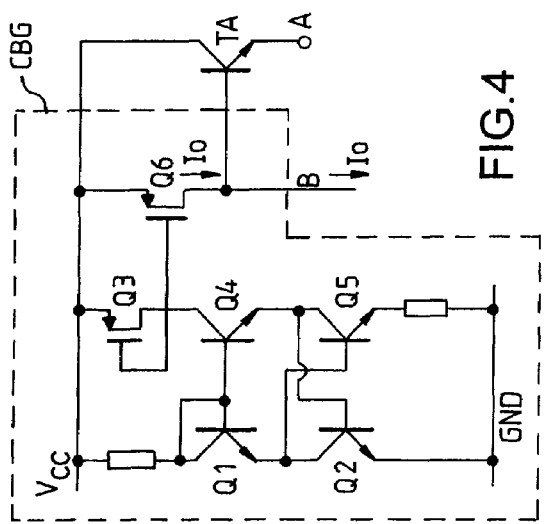
FIG. 4 represents an example of a bandgap type current source that can be used in the first embodiment of the invention.

FIG. 4 represents an example of a current bandgap circuit supplying an outgoing current to the node B to which, furthermore, the base of the transistor TA is connected. This circuit includes six transistors and two resistances, distributed in three branches. The first branch comprises in series between the supply Vcc and ground, and in the following order: a collector resistance, an NPN transistor Q1 mounted as a diode (collector connected to the base) and with its collector connected to the collector resistance, and an NPN transistor Q2, the collector of which is connected to the emitter of Q1 and the emitter of which is connected to ground. The second branch comprises, in series between Vcc and ground, and in the following order: a PMOS transistor Q3 mounted as a diode (drain connected to the gate) and with its source connected to Vcc, an NPN transistor Q4 with its collector connected to the drain of Q3, an NPN transistor Q5 with its collector connected to the emitter of Q4 and its emitter connected through an emitter resistance to ground. The base of Q1 is connected to the base of Q4; the base of Q2 is connected to the emitter of Q4. The base of Q5 is connected to the emitter of Q1. The third branch comprises a PMOS transistor Q6 mounted as a current mirror with respect to Q3, i.e. these two transistors have their sources both connected to Vcc, and their gates connected to each other. The drain of Q6 supplies a constant current Io controlled as a function of temperature and able to be temperature-independent; the value of this current is determined by the dimensions of the transistors, the values of the resistances, and the value of Vcc. This constant current is used as a supply source for the series-connected transistors D1, D2, D3 in FIG. 3. This current is supplied on an output B with a very low voltage drop (about 200 mV or less) relative to Vcc.

From the point B in FIG. 3, a voltage is applied to the base of the transistor TA. A base-emitter voltage drop Vbe is introduced between the point B and the point A which supplies the first differential pair T1, T1b. This voltage drop is the same value Vbe as the other base-emitter voltages of the circuit since the transistor TA is identical to Ts1 and has the same current as Ts1 flowing through it.

The voltage at the node A is therefore Vbias+N·Vbe, as desired.

The current bandgap circuit could employ PNP transistors in place of PMOS transistors.

If neither PNP transistors nor PMOS transistors are available in the technology used, a different embodiment can be adopted for the supply circuit ALP1 for the differential pair T1, T1b.

Figure 5:
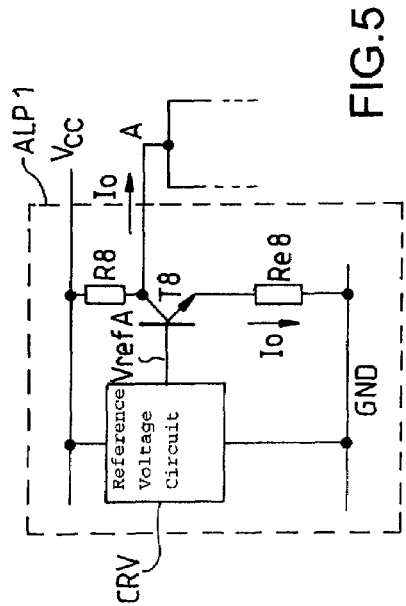
FIG. 5 represents a second embodiment of the current switch according to the invention.

FIG. 5 represents an example of such a different embodiment: the supply circuit ALP1 comprises a series-connected group made up of a collector resistance R8, an NPN transistor T8 and an emitter resistance Re8, the group being placed between the supply Vcc and ground. The base of the transistor T8 is supplied by a voltage from a reference voltage circuit CRV capable of producing a voltage VrefA of any value desired. The particular aspect of the reference voltage circuit CRV is that it supplies a voltage VrefA with this value being independent of the value of the supply Vcc. The transistor T8 is identical to the transistor Ts1 (or, it is repeated here, in a known proportionality relationship, but for the sake of simplification, one identity will be assumed) and the same current Io is arranged to flow through it.

This supply circuit ALP1 supplies the first differential pair in the same way as in FIG. 3, and the current switch comprises the same items as in FIG. 3: translation stages and a second differential pair, which are not represented in FIG. 5.

The collector resistance R8 can be calculated as a function of Vcc in order that the voltage at the node A is Vbias+N·Vbe:

$$2 \cdot Io \cdot R8 = Vcc - Vbias - N \cdot Vbe.$$

If it is desired for Vcc to be small, the voltage drop in the resistance must be small, for example 200 millivolts, and R8 must be chosen accordingly.

The resistance Re8 is chosen so as to establish across its terminals a voltage drop which can be approximately Vbias+(N−1)·Vbe for a current Io. This determines Re8. The voltage VrefA to be applied to the base of T8 can hence be deduced (VrefA=Vbias+N·Vbe) and the circuit CRV capable of supplying this voltage VrefA is constructed.

Figure 6:
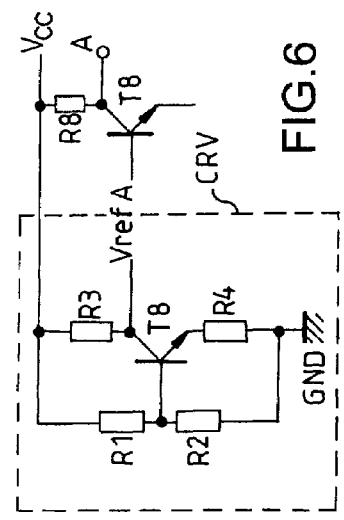
FIG. 6 represents a reference voltage source that does not employ PMOS or PNP transistors and which is used to establish a supply voltage for the first differential pair.

Typically, such a reference voltage circuit CRV is represented in FIG. 6. It comprises four resistances and a transistor T9 and the ratios between the values of the resistances enable this reference voltage value to be obtained for a given value of Vbias and N. The resistances and their values are denoted by Ra1, Ra2, Ra3 and Ra4. The resistances Ra1 and Ra2 are mounted as divider bridges between Vcc and ground and the base of the transistor is supplied by the intermediate tapping point of the divider bridge. The resistance Ra3 is an emitter resistance of the transistor T9, and it is connected to ground. The resistance Ra4 is a collector resistance and it is connected to Vcc. If a simplification is made by stating that VrefA=N'·Vbe, then the ratio Ra3/Ra4 must be equal to N', just like the ratio (Ra1+Ra2)/Ra2.

The voltage VrefA thus produced, independent of the value of Vcc, enables a well defined current to be established in the transistor T8 of the circuit ALP1 and therefore a low and controlled voltage drop in the resistance R8 without resorting to PMOS or NMOS transistors.

Figure 7:
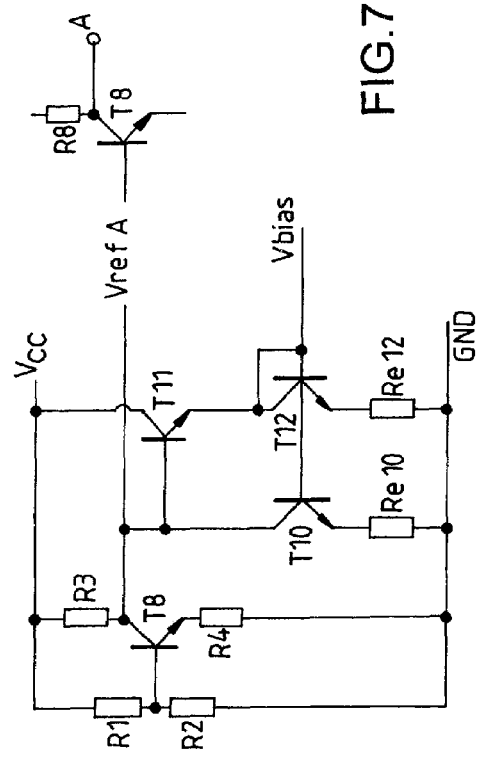
FIG. 7 represents a voltage and current source for establishing both a voltage Vbias and a voltage Vbias+N·Vbe.

The circuit of FIG. 6 can be completed so as to supply not only this reference voltage VrefA but also the voltage Vbias itself that is desired in order to supply the first differential pair (which in the case of FIG. 3 was supplied by the collector of the transistor D1). To this end, additional items as represented in FIG. 7 are added to the circuit of FIG. 6.

These additional items comprise:

an NPN transistor T10 with its collector receiving the voltage VrefA, its emitter connected to ground through an emitter resistance Re10, an NPN transistor T11 with its collector connected to Vcc, its base connected to the collector of T10 (therefore at VrefA), at least one transistor T12 mounted as a diode, with its emitter connected to ground through an emitter resistance Re12, its collector and its base connected to the base of T10, the voltage appearing on this node being the voltage Vbias which is used to control all the bases of transistors forming the current sources supplying current of value Io, or proportional to Io, for the current switching circuit, if necessary other transistors, mounted as diodes, in series between the collector of T12 and the emitter of T11; the total number of series-connected transistors mounted as diodes is N.

Several embodiments have thus been described providing for, by virtue of the principle of the invention, reducing as far as possible the main supply voltage Vcc necessary for the correct operation of the current switch. It is recalled, as mentioned earlier, that all the NPN transistors of the circuit could be replaced by NMOS transistors.

It will be readily seen by one of ordinary skill in the art that embodiments according to the present invention fulfill many of the advantages set forth above. After reading the foregoing specification, one of ordinary skill will be able to affect various changes, substitutions of equivalents and various other aspects of the invention as broadly disclosed herein. It is therefore intended that the protection granted hereon be limited only by the definition contained in the appended claims and equivalents thereof.

The invention claimed is:

1. A current switch comprising:
two differential pairs of two transistors each, these pairs being arranged in cascade form, the second pair having complementary current outputs, one of which supplies current while the other is blocked and vice versa depending on the state of a differential signal applied between the bases of the two transistors of the first pair, the first pair being connected to a ground through a constant current source supplying a current of value Io, this source comprising a transistor, the base of which is held at a bias voltage Vbias, wherein the second differential pair is connected to ground directly through a resistance, and the first differential pair is supplied by a voltage equal to N·Vbe+Vbias, where N is a whole number, and Vbe is the base-emitter voltage of the transistor of the current source supplying the current Io, and wherein the first differential pair has voltage supplied by a supply transistor placed in series between a main supply voltage source Vcc and the differential pair, the supply transistor having its base controlled by a junction node between a low-voltage-drop current source connected to the supply voltage Vcc and a series-connected group, connected to ground, of a plurality of transistors mounted as diodes and a resistance, the voltage Vbias being taken at the base of one of the transistors mounted as a diode.

2. The current switch as claimed in claim 1, wherein the low-voltage-drop current source is a bandgap type source supplying a temperature-regulated current.

3. The current switch as claimed in claim 1, wherein N is equal to 1.

4. The current switch as claimed in claim 1, wherein N is equal to 1.

5. The current switch as claimed in claim 2, wherein N is equal to 1.

6. A current switch comprising:
two differential pairs of two transistors each, these pairs being arranged in cascade form, the second pair having complementary current outputs, one of which supplies current while the other is blocked and vice versa depending on the state of a differential signal applied between the bases of the two transistors of the first pair, the first pair being connected to a ground through a constant current source supplying a current of value Io, this source comprising a transistor, the base of which is held at a bias voltage Vbias;

wherein the second differential pair is connected to ground directly through a resistance, and the first differential pair is supplied by a voltage equal to N·Vbe+Vbias, where N is a whole number, and Vbe is the base-emitter voltage of the transistor of the current source supplying the current Io; and wherein the first differential pair is supplied by the main supply voltage Vcc through a resistance connected on one side to the first differential pair and on the other side to Vcc, and in that means are provided for establishing in this resistance a current such that the voltage drop across its terminals is equal to Vcc−(Vbias+N·Vbe).

7. The current switch as claimed in claim 6, the means for establishing a current in the resistance of the supply for the first differential pair also include means for establishing the bias voltage Vbias.

* * * * *